US008250428B2

(12) United States Patent
Sun et al.

(10) Patent No.: US 8,250,428 B2
(45) Date of Patent: Aug. 21, 2012

(54) SCHEDULING DATA WITH TIME DIVERSITY IN FLOW SYSTEMS

(75) Inventors: Thomas Sun, San Diego, CA (US); Fuyun Ling, San Diego, CA (US); Jing Jiang, San Diego, CA (US); Raghuraman Krishnamoorthi, San Diego, CA (US); Tao Tian, San Diego, CA (US); Kent Walker, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 892 days.

(21) Appl. No.: 12/276,313

(22) Filed: Nov. 22, 2008

(65) Prior Publication Data

US 2010/0131829 A1    May 27, 2010

(51) Int. Cl.
*H03M 13/00* (2006.01)
(52) U.S. Cl. ............... 714/752; 714/758; 714/786
(58) Field of Classification Search .................. 714/752, 714/758, 786
See application file for complete search history.

(56) References Cited

U.S. PATENT DOCUMENTS

| 2003/0021240 | A1* | 1/2003 | Moon et al. ............. 370/320 |
| 2006/0013168 | A1 | 1/2006 | Agrawal et al. |
| 2006/0018279 | A1* | 1/2006 | Agrawal et al. ......... 370/330 |
| 2006/0095827 | A1 | 5/2006 | Spencer et al. |
| 2009/0268694 | A1 | 10/2009 | Sun et al. |

FOREIGN PATENT DOCUMENTS

WO    2005022811    3/2005

OTHER PUBLICATIONS

Murali R Chari et at "FLO Physical Layer: An Overview" IEEE Transactions on Broadcasting, IEEE Service Center, Piscataway, NJ, US, vol. 53, No. 1, Mar. 1, 2007, pp. 145-160, XP011172013, ISSN: 0018-9316, chapter "III. Superframe Structure", chapter "IV.C Data Channels", figures 6, 8-10.
TIA: "Forward Link Only Air Interface Specification Rev. 1.1" Internet Citation, Jun. 26, 2006, XP002387062, Retrieved from the Internet: URL:http://ftp.tiaonline.org/TR-47/TR471/Working/20060110-Arlington-meeting1/TR471-20060110-004a_FLO%20AIS.pdf>[retrieved on Jun. 26, 2006].
"Universal Mobile Telecommunications System (UMTS); User Equipment (UE) radio transmission and reception (FDD) (3GPP TS 25.101 version 7.10.0 Release 7); ETSI TS 125 101", ETSI Standards, LIS, Sophia Antipolis Cedex, France, vol. 3-R4, No. V7.10.0, Jan. 1, 2008, XP014040597, ISSN: 0000-0001, figures A.2, A.3, A.6, A.7, A.8A.

(Continued)

*Primary Examiner* — Sam Rizk
(74) *Attorney, Agent, or Firm* — Ryan N. Farr

(57) ABSTRACT

Methods and systems are described for scheduling data in an FLO system. The method may include turbo encoding the data, and dividing a packet of the turbo-coded data into a plurality of subpackets. The method may include scheduling the turbo-coded packet of data so as to distribute the data across multiple frames of a superframe, by transmitting each one of the subpackets during a different frame of the superframe to increase time diversity. The turbo-coded packet of data may comprise systematic bits and parity bits. The method may include separately scheduling the systematic bits and the parity bits during different frames of the superframe.

37 Claims, 6 Drawing Sheets

OTHER PUBLICATIONS

Khaled Daoud Ed-Chin E Lin et al: "Performance Comparison of the DVB-H and FLO Mobile Broadcasting Systems", Consumer Electronics, 2007. ISCE 2007. IEEE International Symposium On, IEEE, PI, Jun. 1, 2007, pp. 1-7, XP031160314, ISBN: 978-1-4244-1109-2, the whole document.

International Search Report, PCT/US2009/065059, International Searching Authority, European Patent Office, Mar. 26, 2010.
Written Opinion, PCT/US2009/065059, International Searching Authority, European Patent Office, Mar. 26, 2010.

* cited by examiner

SCHEDULING DATA WITH TIME DIVERSITY IN FLOW SYSTEMS

BACKGROUND

The present disclosure relates generally to telecommunications, and more specifically, to methods and systems for scheduling data in FLO (Forward Link Only) systems.

Forward Link Only (FLO) is a digital wireless technology that uses advances in coding and interleaving to achieve high-quality reception, both for real-time content streaming and other data services. FLO technology can provide robust mobile performance and high capacity without compromising power consumption.

In current FLO systems, the turbo packets of each code block are equally distributed in all of frames of the superframe. The encoded bits in a turbo packet are transmitted at the same time if they are scheduled on one OFDM symbol, or they are close to each other in transmitting time if they are scheduled on different OFDM symbols adjacent in time. As a result, turbo decoding in current FLO systems utilizes limited time diversity, especially at low vehicle speed.

There is a need for methods and systems that can increase time diversity and enhance the performance of FLO systems. It is also desirable that methods and systems be provided for supporting early entry and early exit features in FLO systems.

SUMMARY

A method of scheduling data in an FLO system may include turbo encoding the data, and dividing a packet of the turbo-coded data into a plurality of subpackets. The method may include scheduling the turbo-coded packet of data so as to distribute the data across multiple frames of a superframe, by transmitting each one of the subpackets during a different frame of the superframe to increase time diversity. The turbo-coded packet of data may comprise systematic bits and parity bits. The method may include separately scheduling the systematic bits and the parity bits during different frames of the superframe.

BRIEF DESCRIPTION OF THE DRAWINGS

The drawing figures depict one or more implementations in accord with the present concepts, by way of example only, not by way of limitations. The drawings disclose illustrative embodiments. They do not set forth all embodiments. Other embodiments may be used in addition or instead. In the figures, like reference numerals refer to the same or similar elements.

DETAILED DESCRIPTION

Methods and systems are described for scheduling data in a FLO system in such a way that a long turbo code block spans over multiple frames of a superframe. In this way, better time diversity is achieved, and the performance of the FLO system is enhanced.

It is contemplated that the subject matter described herein may be embodied in many forms. Accordingly, the embodiments described in detail below are illustrative embodiments, and are not to be considered limitations. Other embodiments may be used in addition or instead.

A turbo encoder typically includes two RSC (Recursive Systematic Convolutional) encoders that are concatenated, with an interleaver disposed in between them. The interleaver reorders the input data sequence. The combined effect of the interleaver and the RSC encoder generally leads to a high code weight composite codeword.

In current FLO systems the turbo encoder consists of two identical 8-state constituent encoders connected in parallel and separated by a bit interleaver. In the illustrated embodiment, the length of the code block is 994. The turbo code rates supported in FLO are: $\{1/5, 1/3, 1/2, 2/3\}$. The rate $1/5$ is only used for transmitting the overhead information symbols (OIS). The other three rates are punctured from the $1/5$ code. The basic turbo encoder and decoder in FLO are the same as those in the IS-2000 and IS-2000 EV-DO with some variations in puncture patterns.

Figure 1:
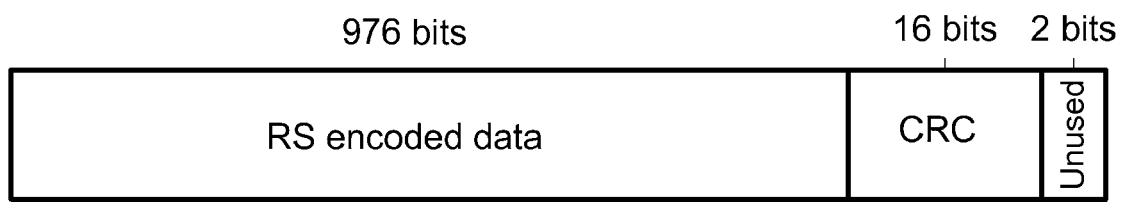
FIG. 1 is a conceptual block diagram illustrating an FLO turbo packet structure.

FIG. 1 is a conceptual block diagram illustrating a conventional FLO turbo packet structure. A superframe in current FLO systems lasts one second. In one embodiment, the superframe may consist of 4 frames, each lasting approximately 0.25 second. The data bits are Reed-Solomon encoded and organized as Reed-Solomon (RS) code blocks. Each RS code block consists of 16 MAC packets. Each MAC packet contains 994 bits and has the structure illustrated in FIG. 2.

In one embodiment of the present disclosure, the turbo coded blocks are distributed across multiple frames, in order to achieve better time diversity and significantly enhance system performance, for example under time varying fading channels.

Figure 2:
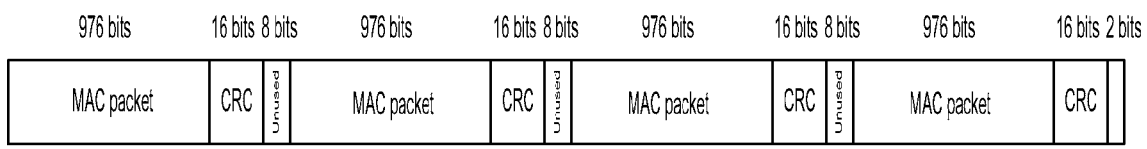
FIG. 2 is a conceptual block diagram illustrating an example of a FLO long turbo packet that consists of multiple MAC packets.

FIG. 2 is a conceptual block diagram illustrating the combination of a FLO long turbo packet with multiple MAC packets. To make the turbo coding change transparent to the MAC layer, four ~1K (precisely, 994) length FLO MAC packets are combined. This ~4K (actually 3994) long data packet is then turbo encoded into one single long coded packet. The 8K and 16K code block length turbo packets are generated similarly. To achieve more time diversity, a superframe may be into eight, or even sixteen frames. Since no RS coding will be applied in the long turbo coding scheme illustrated in FIG. 2, other turbo code rates can be used, in addition to the current 4 turbo code rates $\{1/5, 1/3, 1/2, 2/3\}$.

In some embodiments, by distributing a long turbo code across multiple frames of a superframe as described above, early entry and early exit features may be supported in FLO systems.

When a channel switch button is pressed on the FLO handset, it usually takes about one second for the handset to switch from the current channel to a new channel. However, if the channel switch command is detected at the $1^{st}$ frame of the superframe, and the OIS was decoded correctly, the handset is able to decode the data packets for the new channel on current superframe without error at high signal to noise ratio (SNR), even if the packets scheduled on the $1^{st}$ frame are not received by the handset. This feature is commonly referred to as "early entry".

Again, with high SNR, the handset is able to decode the data packets with only systematic bits and parity bits received during the $1^{st}$, $2^{nd}$ and $3^{rd}$ frame. In fact, the handset is decoding the data packets at a code rate which is higher than the transmitted code rate. This feature is commonly referred to as "early exit." Since the hardware does not need to wake up during the $4^{th}$ frame, the early exit scheme saves the power consumption.

In one embodiment, data may be scheduled in a FLO system by scheduling the systematic bits first, i.e. during the first few frames, followed by parity bits. This scheduling scheme achieves power saving with good channel condition.

For example, in the case of a code rate of ½ case, the systematic bits may be scheduled in the frames of the first half superframe, while the parity bits may be scheduled in the frames of the second half superframe.

In this way, in a high SNR channel the receiver may receive un-coded systematic bits error free without turbo decoding. If the CRC fails without turbo decoding, the receiver may attempt to decode the packets successfully as rate ⅔ code with the parity bits only from the $3^{rd}$ quarter of the superframe if the SNR is high enough. As a result, the receiver does not need to wake up during the $4^{th}$ quarter of the superframe to save hand set power.

If the receiver wants to try "early entry" switching at the $1^{st}$ frame of the superframe, the systematic bits may be scheduled starting at the $2^{nd}$ frame of the superframe. In the early entry case, the receiver may use the parity bits in the $4^{th}$ frame, along with the systematic bits on the $2^{nd}$ and the $3^{rd}$ frame, and may try to decode the packets as rate ⅔ code when the SNR is high.

Results of simulations have shown that for rate ⅓ and ½ turbo code rate at low, medium, and high Doppler speed, there is no noticeable performance degradation due to the scheduling of all systematic bits at the front frames.

In another embodiment, in the case of code rate<½, the systematic bits may be scheduled in the middle frame(s) and the parity bits in the first and last frame(s).

For high code rate (>½) cases, after scheduling systematic bits in the $2^{nd}$ and $3^{rd}$ frame, there are still some systematic bits left. The remaining systematic bits can be equally scheduled in the $1^{st}$ and $4^{th}$ frames.

Simulation results have shown that for rate ⅓ and ½ turbo code rate at low, medium, and high Doppler speed respectively, there is no noticeable performance degradation due to the scheduling of all systematic bits together while all parity bits together when using the received samples in all 4 frames comparing to the case of both parity and systematic bits even distributed over the 4 frames.

Simulation of various FLO modes have been performed under fading channel, with systematic bits scheduled at the front frame(s) of a superframe. The simulation results in low, medium and high Doppler fading channel have shown that there is no noticeable performance loss due to scheduling systematic bits together in FLO system.

If turbo encoding/decoding schemes are implemented with turbo encoded bits distributed over multiple frames of a superframe, the FLO system performance will be significantly improved, with better time diversity. In one embodiment, all the systematic bits may be scheduled together in the front frame(s) of the superframe, to save handset power. If all the systematic bits are scheduled in the front frame(s), erasure of systematic bits may be avoided when early exit happens when the last frame is erased, although it is not necessary to avoid the erasure of the systematic bits.

If the systematic bits and parity bits are randomly scheduled, when the last frame is erased during "early exit," the performance is a little worse, compared to the case in which no systematic bits are erased. There is thus a trade-off between random scheduling of the systematic bits and parity bits, on the one hand, and separately scheduling of the systematic bits and parity bits, on the other. The advantage of random scheduling is low implementation complexity, while the disadvantage of random scheduling is increased degradation. The advantage of separately scheduling systematic bits and parity bits is less degradation, while the disadvantage of separately scheduling systematic bits and parity bits is high implementation complexity. Both cases are described in the present disclosure.

Figure 3:
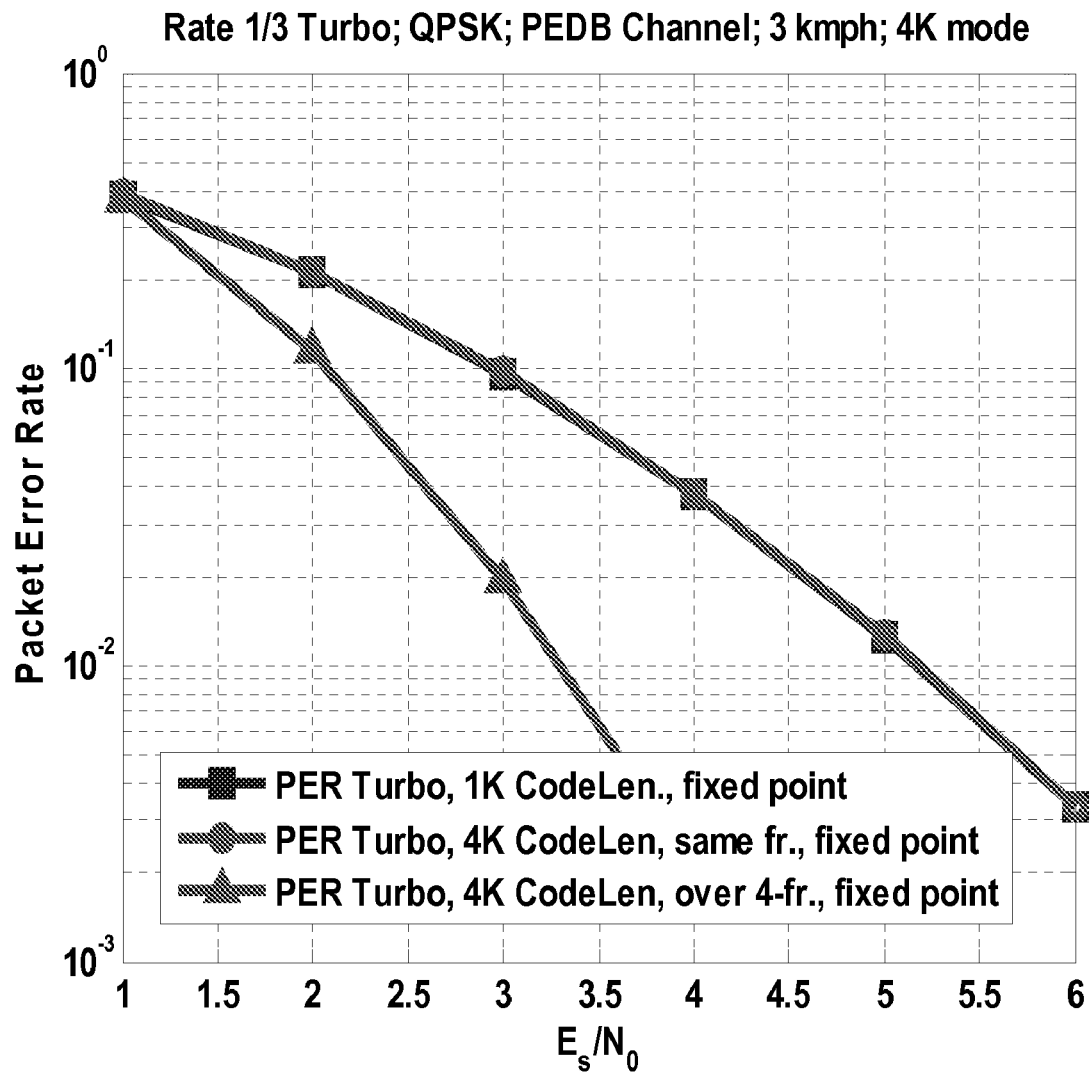
FIG. 3 illustrates simulation results that compare the performance of random scheduling, with separate scheduling of the schematic bits and the parity bits.

FIG. 3 illustrates simulation results that compare the performance of scheduling the turbo packet on the same frame, on the one hand, with generating a 4K turbo coded packet by combining 4 MAC packets before each MAC packet is scheduled in a different frame, on the other.

It is known that if the turbo code block size is increased, a few tenth of a dB performance gain can be achieved in AWGN channel. However, the turbo coded blocks are distributed across multiple frames, it is possible to achieve better time diversity and to significantly improve system performance under time varying fading channels.

In FIG. 3, the performance of a scheme in which the 4K turbo coded packet is scheduled on the same frame is represented by a curve that interconnects square-shaped data. The performance of a scheme in which the 4K turbo coded packet is divided into 4 sub-packets before each sub-packet is scheduled in a different frame, is shown with a curve that interconnects triangle-shaped data. It can be seen from FIG. 3 that the latter case has better performance (1.7 dB) due to the fact that the latter scheme utilizes time diversity better than the former scheme.

One draw back of scheduling systematic bits and parity bits separately in the previous section is that the implementation complexity increases significantly at both transmitter and receiver side when quite a few code rates are required to be supported. Consequently, it is of interest to know if the degradation due to erasing of systematic bits is tolerable when turbo coded bits are just randomly interleaved.

In one embodiment in which a long turbo code spanning the whole superframe is used, a random block interleaver may be added at the turbo encoder output to enhance performance of the FLO system.

Figure 4:
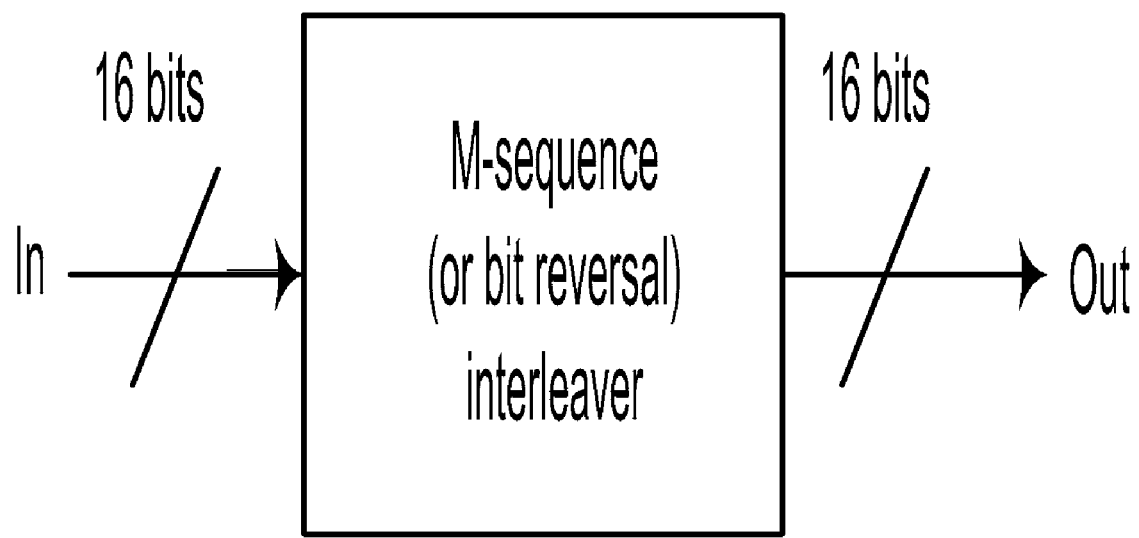
FIG. 4 illustrates a random block interleaver, used in one embodiment of the present disclosure.

FIG. 4 is a schematic block diagram of a random block interleaver, used in one embodiment of the present disclosure. The random interleaver can be simply generated using the random number generation function in MATLAB off line, and loaded in as a look-up-table. To simplify hardware implementation, the interleaver may also be generated on the fly with a PN m-sequence generator, or with bit reversal interleaver generator.

To support the code rate>=⅓, any primitive polynomial with >=16 binary storage elements for m-sequence generator may be selected. For example, the primitive polynomial of sequence generator with 16 binary storage elements $$x^{16}+x^{12}+x^3+x+1$$

may be used. The period of the above-described m-sequence is 65535. With a non-zero initial state, the shift register may go through all 65535 distinct states one clock at a time.

The PN m-sequence interleaver may include one 16-bit up-counting counters and a shift register constructed from the above primitive polynomial.

Figure 5:
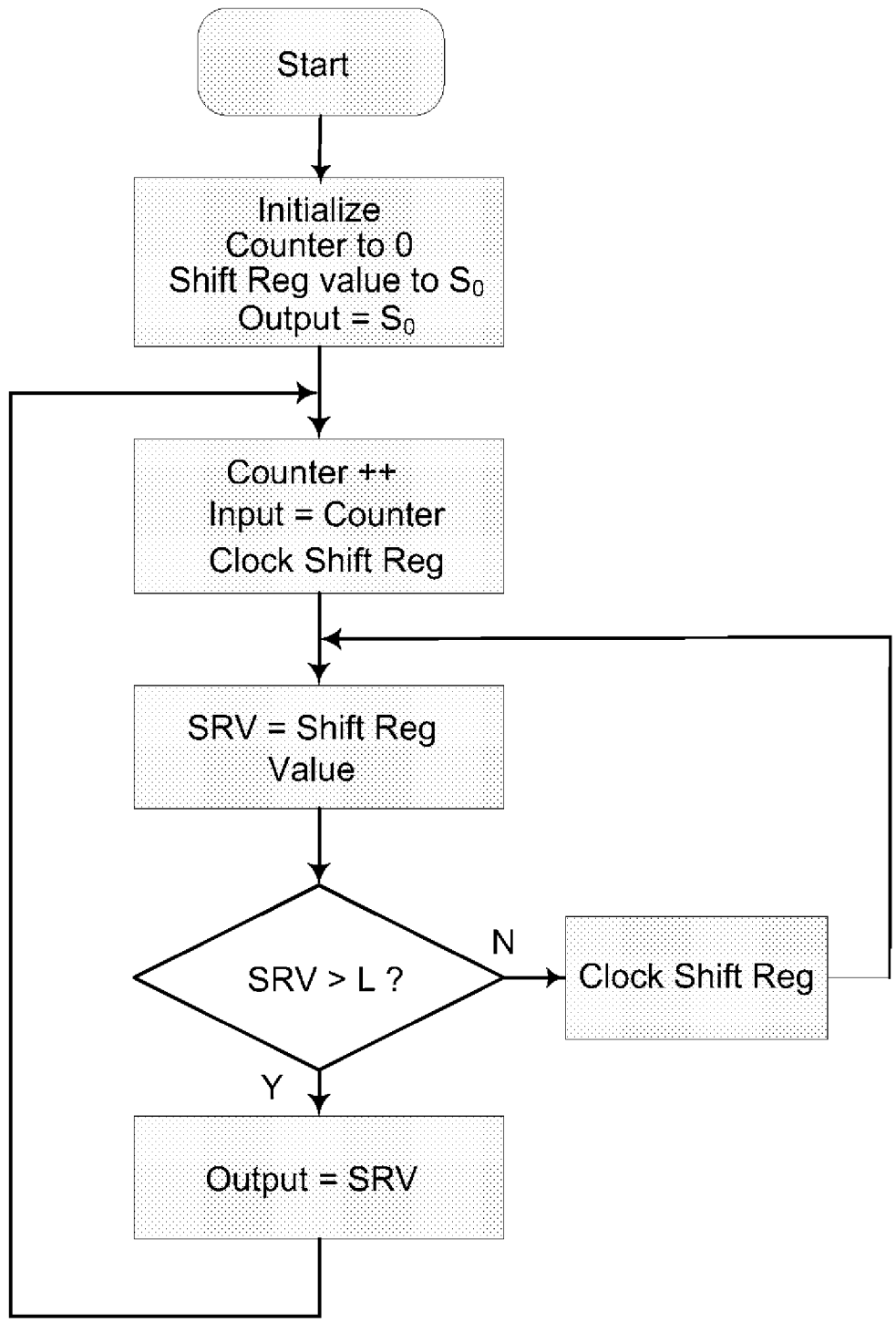
FIG. 5 is a flow chart for generating reduced set PN m-sequence interleaver with length L.

FIG. 5 illustrates a flow chart of one example of an algorithm for generating the interleaved output sequence of the length L input sequence in natural order from 0 to L−1. The initial state of the shift register $S_0$ is a non-zero value less than L.

For a code block of 16000 information bits and code rate of ⅓, L is 48000.

Figure 6:
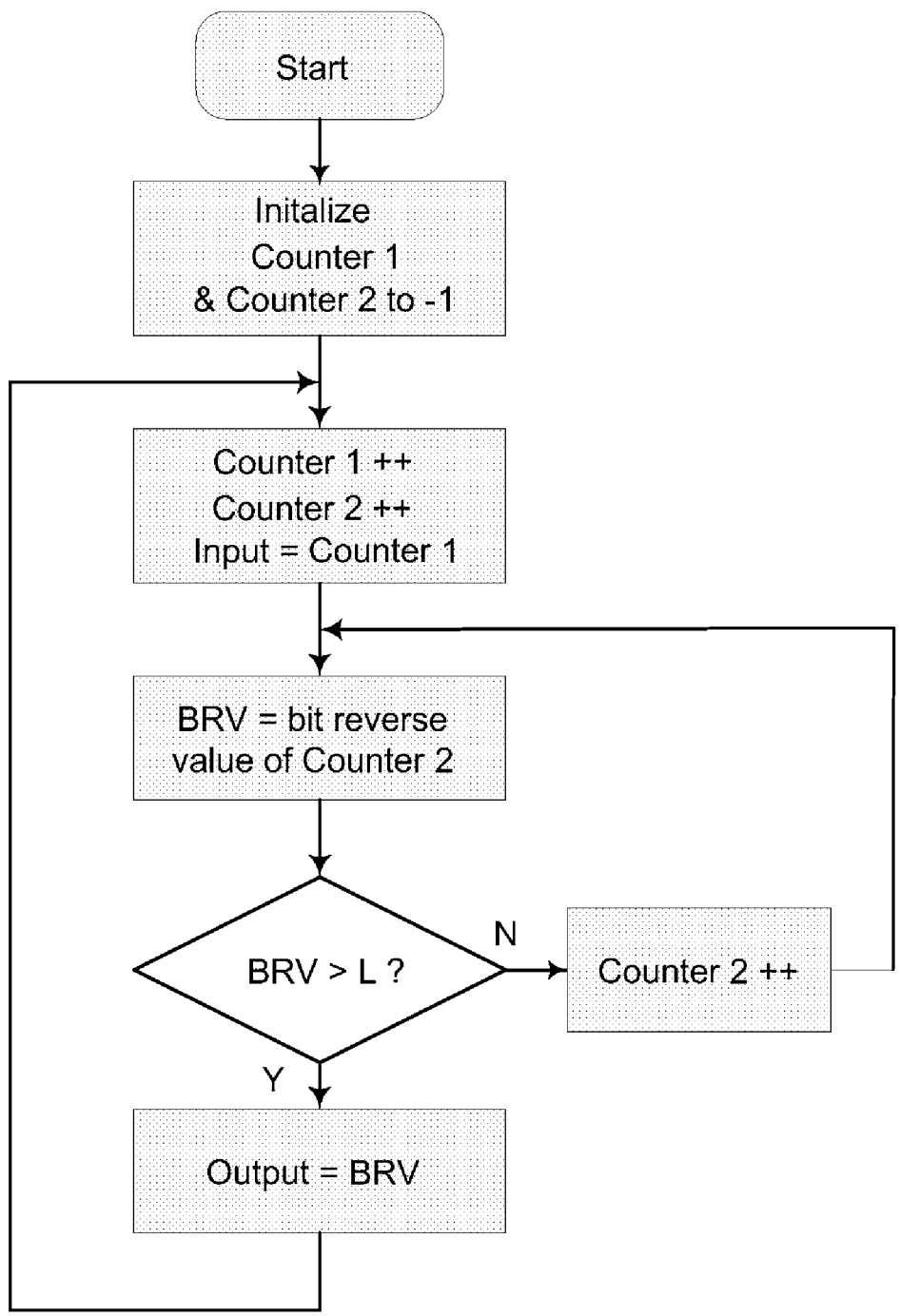
FIG. 6 is a flow chart for generating reduced set bit reversal interleaver with length L.

Similarly, a reduced set bit reversal interleaver may also be implemented. The interleaver consists of two 16-bit up-counting counters (counter 1 and counter 2). FIG. 6 shows a flow chart of the algorithm of generating the interleaved output sequence of the length L input sequence in natural order from 0 to L−1.

Simulation results have shown the performance of 16 QAM rate ½ turbo code with one frame erased is close to but worse than 16 QAM rate ½ turbo code without erasure at low, and high Doppler speed. Accordingly, the early entry and early exit features only work at high SNR.

If the systematic bits and parity bits are scheduled separately so as to avoid systematic bits being erased, along with carefully scheduling parity bits, the performance may be better than using the random or bit reversal interleaver by 0.2 to 0.5 dB.

In the two schemes described above, namely separate scheduling of systematic versus parity bits, and block interleaving of the turbo-encoded data, there is a tradeoff between performance and complexity. With low complexity, the block interleaving scheme with erasure of systematic bits, the PER performance is about 0.2 dB worse than that of the case without erasure of systematic bit in AWGN channel. In fading channel, that gap increases to 0.4 to 0.5 dB. Overall the price of low complexity is tolerable.

In sum, methods and systems for implementing turbo encoding/decoding schemes with turbo encoded bits spread over multiple frames of a superframe have been disclosed. These methods and systems significantly enhance the FLO system performance with better time diversity. Several schemes have been disclosed for supporting early entry/early exit features in FLO with small performance degradation.

In one embodiment, all the systematic bits can be scheduled in the middle frame(s) of the superframe, while all parity bits can be scheduled in the beginning and ending frame(s) to achieve least performance degradation. In another embodiment, the systematic and parity bits are randomly interleaved together to reduce implementation complexity at a tolerable performance loss. The random interleaver may be implemented with a look-up-table based pre-generated interleaver, or an on the fly generated reduced set PN sequence based (or bit reversal based) random interleaver.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in random access memory (RAM), flash memory, read-only memory (ROM), erasable programmable read-only memory (EPROM), Electrically Erasable Programmable Read-Only Memory (EEPROM), registers, hard disk, a removable disk, a compact-disk read-only memory (CD-ROM), or any other form of storage medium known in the art. A storage medium may be coupled to the processor such that the processor can read information from, and write information to, the storage medium. In the alternative, the storage medium may be integral to the processor.

A processing system may include means for turbo encoding the data and dividing a packet of the turbo-coded data into a plurality of subpackets, and means for scheduling the turbo-coded packet of data so as to distribute the data across multiple frames of a superframe. The means for scheduling the turbo-coded packet of data may include means for separately scheduling the systematic bits and the parity bits during different frames of the superframe.

An apparatus may include a turbo encoder configured to turbo encode data to generate a packet of turbo-coded data, and a scheduling system configured to divide the packet of the turbo-coded data into a plurality of subpackets. The scheduling system further configured to schedule the turbo-coded packet of data so as to distribute the data across multiple frames of a superframe in an FLO system, by transmitting each one of the subpackets during a different frame of the superframe to increase time diversity.

The apparatus may further include a data interleaver configured to randomly interleave the turbo-encoded systematic bits and the parity bits together.

A computer-readable medium may have stored therein computer-readable instructions for a processor, wherein said instructions when executed by said processor cause the processor to turbo code the data, divide a packet of the turbo-coded data into a plurality of subpackets, and schedule a transmission of the turbo-coded packet of data in an FLO system so as to distribute the data across multiple frames of a superframe in the FLO system, by transmitting each one of the subpackets during a different frame of the superframe to increase time diversity. The instructions may further cause the processor to separately schedule the systematic bits and the parity bits during different frames of the superframe.

It should be noted that various changes and modifications to the embodiments described herein will be apparent to those skilled in the art. Such changes and modifications may be made without departing from the spirit and scope of the present disclosure and without diminishing its attendant advantages.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

The phrase "means for" when used in a claim embraces the corresponding structures and materials that have been described and their equivalents. Similarly, the phrase "step for" when used in a claim embraces the corresponding acts that have been described and their equivalents. The absence of these phrases means that the claim is not limited to any of the corresponding structures, materials, or acts or to their equivalents.

Nothing that has been stated or illustrated is intended to cause a dedication of any component, step, feature, object, benefit, advantage, or equivalent to the public, regardless of whether it is recited in the claims.

In short, the scope of protection is limited solely by the claims that now follow. That scope is intended to be as broad as is reasonably consistent with the language that is used in the claims and to encompass all structural and functional equivalents.

What is claimed is:

1. A method of scheduling transmission of data in a wireless broadcast system, the method comprising:
   turbo encoding the data;
   dividing a packet of the turbo-coded data into a plurality of subpackets; and
   scheduling the turbo-coded data in order to distribute the data across multiple subframes of a frame by transmitting each one of the plurality of subpackets during a different subframe of the frame to increase time diversity;
   wherein the turbo-coded data comprise systematic bits and parity bits.

2. The method of claim 1, wherein scheduling the turbo-coded data comprises separately scheduling the systematic bits and the parity bits during different subframes of the frame.

3. The method of claim 2,
   wherein the frame comprises four subframes; and
   wherein the act of scheduling the turbo-coded data comprises:
   scheduling the systematic bits during the second subframe and the third subframe; and
   scheduling the parity bits during the first subframe and the fourth subframe.

4. The method of claim 3, wherein the code rate is less than or equal to about ½.

5. The method of claim 2,
   wherein the act of scheduling the turbo-coded data comprises:
   scheduling all the systematic bits together in the beginning of a frame, and scheduling all the parity bits after the systematic bits are scheduled.

6. The method of claim 1, wherein scheduling the turbo-coded data comprises:
   scheduling all the systematic bits together during a first half of the frame, and scheduling all the parity bits together during a second half of the frame.

7. The method of claim 1, wherein the frame comprises four subframes; and
   wherein the act of scheduling the turbo-coded data comprises:
   during the first subframe of the frame, scheduling only parity bits; and
   scheduling the systematic bits starting from the second subframe of the frame, so that early entry switching can be performed at the first subframe of the frame, without systematic bits being erased in the first subframe of the frame.

8. The method of claim 1, further comprising the act of randomly interleaving the turbo-encoded systematic bits and the parity bits together.

9. The method of claim 8, wherein the act of randomly interleaving comprises implementing at least one of:
   a look-up table based pre-generated interleaver;
   an on-the-fly generated reduced set PN (pseudonoise) based random interleaver; and
   an on-the-fly generated bit reversal based random interleaver.

10. The method of claim 1,
    wherein the frame comprises a number N of subframes, where N is one of: eight, sixteen, thirty-two, and sixty-four; and
    further comprising the act of supporting an early entry feature by decoding at a higher code rate without receiving samples from the first m subframes, where m is: 1, 2, ..., N/2.

11. The method of claim 1,
    wherein the frame comprises a number N of subframes, where N is one of: eight, sixteen, thirty-two, and sixty-four; and
    further comprising the act of supporting an early exit feature by decoding at a higher code rate without receiving samples from the last m subframes, where m is: 1, 2, ..., N/2.

12. The method of claim 1,
    wherein the frame comprises a number N of subframes, where N is an integer greater than or equal to two.

13. An apparatus comprising:
    a turbo encoder configured to turbo encode data to generate a packet of turbo-coded data; and
    a scheduling system configured to divide the packet of the turbo-coded data into a plurality of subpackets, the scheduling system further configured to schedule the turbo-coded data in order to distribute the data across multiple subframes of a frame in a wireless broadcast system by transmitting each one of the plurality of subpackets during a different subframe of the frame to increase time diversity.

14. The apparatus of claim 13,
    wherein the turbo-coded data comprise systematic bits and parity bits.

15. The apparatus of claim 13,
    wherein the scheduling system is configured to separately schedule the systematic bits and the parity bits during different subframes of the frame.

16. The apparatus of claim 13,
    wherein the scheduling system is configured to schedule all the systematic bits together in the beginning of a frame, and to schedule all the parity bits after the systematic bits are scheduled.

17. The apparatus of claim 13,
    wherein the scheduling system is configured to schedule all the systematic bits together during a first half of the frame, and to schedule all the parity bits together during a second half of the frame; and
    wherein the code rate is ½.

18. The apparatus of claim 13,
    wherein the frame comprises four subframes; and
    wherein the scheduling system is configured to:
    during the first subframe of the frame, scheduling only parity bits; and
    schedule the systematic bits starting from the second subframe of the frame, so that early entry switching can be performed at the first subframe of the frame.

19. The apparatus of claim 18, wherein the code rate is less than or equal to about ½.

20. The apparatus of claim 13,
    wherein the frame comprises four subframes; and
    wherein the scheduling system is configured to:
    schedule the systematic bits during the second subframe and the third subframe; and
    schedule the parity bits during the first subframe and the fourth subframe.

21. The apparatus of claim 13, further comprising a data interleaver configured to randomly interleave the turbo-encoded systematic bits and the parity bits together.

22. The apparatus of claim 21, wherein the data interleaver comprises at least one of:
a look-up table based pre-generated interleaver;
an on-the-fly generated reduced set PN (pseudonoise) based random interleaver; and
an on-the-fly generated bit reversal based random interleaver.

23. The apparatus of claim 13, wherein the frame comprises a number N of subframes, where N is one of: eight, sixteen, thirty-two, and sixty-four; and
wherein the apparatus is further configured to support an early entry feature, when the SNR is relatively high, by decoding at a higher code rate without receiving samples from the first m subframes, where m is: 1, 2, . . . , N/2.

24. The apparatus of claim 13, wherein the frame comprises a number N of subframes, where N is one of: eight, sixteen, thirty-two, and sixty-four; and
wherein the apparatus is further configured to support an early exit feature, when the SNR is relatively high, by decoding at a higher code rate without receiving samples from the last m subframes, where m is: 1, 2, . . . , N/2.

25. The apparatus of claim 13,
wherein the frame comprises a number N of subframes, where N is an integer greater than or equal to two.

26. A computer-readable medium having stored therein computer-readable instructions for a processor, wherein said instructions when executed by said processor cause said processor to:
turbo encode the data;
divide a packet of the turbo-coded data into a plurality of subpackets; and
schedule a transmission of the turbo-coded data in a wireless broadcast system so as to distribute the data across multiple subframes of a frame in the wireless broadcast system, by transmitting each one of the plurality of subpackets during a different subframe of the frame to increase time diversity;
wherein the turbo-coded data comprise systematic bits and parity bits.

27. The computer-readable medium of claim 26,
wherein the instructions further cause the processor to:
separately schedule the systematic bits and the parity bits during different subframes of the frame.

28. The computer-readable medium of claim 26,
wherein the instructions further cause the processor to:
schedule all the systematic bits together during a first half of the frame, and schedule all the parity bits together during a second half of the frame.

29. The computer-readable medium of claim 26,
wherein the frame comprises four subframes; and
wherein the instructions further cause the processor to:
during the first subframe of the frame, schedule only parity bits; and
schedule the systematic bits starting only from the second subframe of the frame, so that early entry switching can be performed at the first subframe.

30. The computer-readable medium of claim 26,
wherein the frame comprises four subframes; and
wherein the instructions further cause the processor to:
schedule the systematic bits during the second subframe and the third subframe; and
schedule the parity bits during the first subframe and the fourth subframe.

31. The computer-readable medium of claim 30,
wherein the code rate is less than or equal to about ½.

32. A processing system, comprising:
means for turbo encoding the data, and for dividing a packet of the turbo-coded data into a plurality of subpackets; and
means for scheduling the turbo-coded data so as to distribute the data across multiple subframes of a frame;
wherein the turbo-coded data comprise systematic bits and parity bits.

33. The processing system of claim 32,
wherein the means for scheduling the turbo-coded data comprises means for separately scheduling the systematic bits and the parity bits during different subframes of the frame.

34. The processing system of claim 32,
wherein the means for scheduling the turbo-coded data comprises:
means for scheduling all the systematic bits together during a first half of the frame, and scheduling all the parity bits together during a second half of the frame.

35. The processing system of claim 32,
wherein the means for scheduling the turbo-coded data comprises:
means for supporting early entry switching.

36. The processing system of claim 32, wherein the means for scheduling the turbo-coded data comprises:
means for supporting early exit switching.

37. The processing system of claim 32, further comprising means for randomly interleaving the turbo-encoded systematic bits and the parity bits together.

* * * * *